(12) United States Patent
Zhang

(10) Patent No.: US 6,456,121 B2
(45) Date of Patent: *Sep. 24, 2002

(54) SENSE AMPLIFIER FOR INTEGRATED CIRCUITS USING PMOS TRANSISTORS

(75) Inventor: Kevin X. Zhang, Portland, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/351,141

(22) Filed: Jul. 12, 1999

(51) Int. Cl.[7] .............................................. G01R 19/00
(52) U.S. Cl. .......................................... 327/52; 327/55
(58) Field of Search ........................ 326/95, 112, 115; 327/200, 211, 212, 51, 52, 53, 54, 55, 56, 57; 365/205, 207

(56) References Cited

U.S. PATENT DOCUMENTS

| | | | |
|---|---|---|---|
| 4,123,799 A | * 10/1978 | Peterson ..................... 365/205 |
| 4,561,702 A | 12/1985 | McAdams ..................... 326/68 |
| 4,751,681 A | * 6/1988 | Hashimoto ................... 365/207 |
| 5,144,168 A | 9/1992 | Tran ............................ 326/87 |
| 5,668,765 A | * 9/1997 | Ang ............................ 365/205 |
| 5,699,304 A | * 12/1997 | Jung et al. ................. 365/189.1 |
| 5,729,159 A | 3/1998 | Gersbach ..................... 327/52 |
| 5,796,273 A | 8/1998 | Jung et al. ................... 327/55 |
| 5,834,953 A | * 11/1998 | Klass et al. ................... 327/57 |
| 5,850,359 A | * 12/1998 | Liu ............................ 365/156 |
| 5,920,218 A | * 7/1999 | Klass et al. .................. 327/200 |
| 6,028,454 A | * 2/2000 | Elmarsy et al. ............. 326/115 |
| 6,137,319 A | * 10/2000 | Krishnamurthy et al. ..... 327/51 |

OTHER PUBLICATIONS

Samurai et al, "Low–Power CMS Design through $V_{th}$ Control and Low–Swing Circuits", 1997 International Symposium on Low Power Electronics and Design, Aug. 18–20, 1997, Monterery, California; Association for Computing Machinery, New York, New York.

* cited by examiner

Primary Examiner—Matthew Smith
Assistant Examiner—Paul Dinh
(74) Attorney, Agent, or Firm—Kenyon & Kenyon

(57) ABSTRACT

A sense amplifier includes a pair of differential input terminals and a pair of differential output terminals. Each of a pair of precharge circuits connects a respective one of the differential output terminals to precharge potential and has a clocking input. The precharge circuits maintains the respective differential output terminals at ground in response to a precharge state of a signal at the clocking input. The sense amplifier also may include a pair of evaluation circuits, each connecting a respective one of the differential output terminals to an evaluation potential and coupled to a respective one of the differential input terminals. The evaluation circuits may transition the respective output terminal to an evaluation voltage in response to an evaluation state of a signal at the respective differential input terminal. Further, the sense amplifier may include a pair of clamping circuits, each connecting a respective one of the differential output terminals to ground and maintaining the respective one of the differential output terminal at ground in response to an evaluation voltage at the other of the differential output terminals.

29 Claims, 1 Drawing Sheet

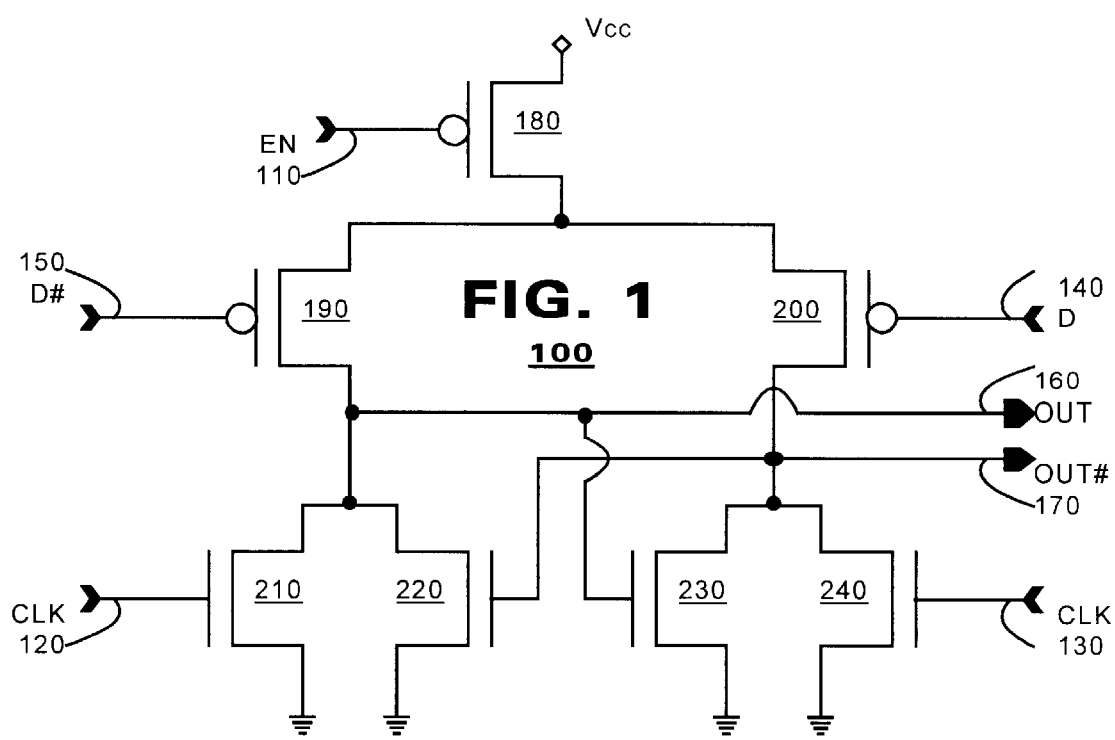

SENSE AMPLIFIER FOR INTEGRATED CIRCUITS USING PMOS TRANSISTORS

BACKGROUND

The present invention relates to an improved architecture for a sense amplifier in integrated circuits, to sense small differential signals between ground and a small positive potential.

Increasing attention has been given to sense amplifiers for use in low voltage swing circuits. In low voltage swing circuits, data signals may be carried throughout the circuit as a pair of data signals, a true signal and a complement signal, where the complement signal is a voltage that represent the logical inverse of the true signal. Typically, the true and complement signals are precharged to a predetermined value. During an evaluation phase, the true and complement signals are permitted to carry actual data. One of the signals will evaluate to a different potential than the precharge potential. A sense amplifier for such an application is designed to sense small voltage differentials between the true and complement signals and generate true and complementary output signals in response thereto. By generating output signals in response to the small differentials, the sense amplifier can generate valid output signals without requiring the input data to complete a "full rail" transition (e.g. transition fully to $V_{CC}$ or ground). Such a sense amplifier achieves higher throughput and faster speed than circuits that require full rail transitions.

Sense amplifiers are carefully designed to ensure that they include only a minimum number of components sufficient for their operation. A sense amplifier that includes unnecessary components typically has a slower response; it also may consume unnecessary power. Accordingly, there is a continuing need in the art for an LVS sense amplifier having a minimal number of components.

SUMMARY

An embodiment of the present invention provides a sense amplifier circuit that includes a pair of differential input terminals and a pair of differential output terminals. Each of a pair of precharge circuits connects a respective one of the differential output terminals to precharge potential and has a clocking input. The precharge circuits maintains the respective differential output terminals at ground in response to a precharge state of a signal at the clocking input. The sense amplifier also may include a pair of evaluation circuits, each connecting a respective one of the differential output terminals to an evaluation potential and coupled to a respective one of the differential input terminals. The evaluation circuits may transition the respective output terminal to an evaluation voltage in response to an evaluation state of a signal at the respective differential input terminal. Further, the sense amplifier may include a pair of clamping circuits, each connecting a respective one of the differential output terminals to ground and maintaining the respective one of the differential output terminal at ground in response to an evaluation voltage at the other of the differential output terminals.

BRIEF DESCRIPTION OF THE DRAWINGS

FIG. 1 is a circuit diagram according to an embodiment of the present invention.

DETAILED DESCRIPTION

The present invention provides an improved architecture for PMOS based sense amplifiers for use in an integrated circuit. The improved architecture employs fewer components than in a traditional PMOS based sense amplifiers, provides improved speed and, therefore, can contributed to higher performance of integrated circuits.

According to an embodiment of the present invention, the sense amplifier 100 is adapted for use in low voltage swing ("LVS") circuits. LVS circuits typically carry data in true and complement form. Thus, for a data signal d, an LVS circuit also will carry its logical complement (usually labeled, "d#") on a second data signal.

FIG. 1 illustrates a sense amplifier 100 constructed in accordance with an embodiment of the present invention. The sense amplifier 100 includes terminals for a clock signal (terminals 110–130) and true and complement data signals (terminals 140, 150). The sense amplifier 100 also includes terminals 160, 170 for an output signal and its complement.

The sense amplifier 100 may be populated by a number of transistors. An enable transistor 180 is coupled to $V_{CC}$ at its source and receives a signal from input terminal 110 on an input. A first data transistor 190 couples the drain of the enable transistor 180 to the OUT terminal 160 across a source to drain path. The first data transistor 190 receives the D data signal on input terminal 150. A second data transistor 200 couples the drain of the enable transistor 180 to the OUT# terminal 170 across a source to drain path. The second data transistor 200 receives the D data signal on input terminal 140. According to an embodiment, the first and second data transistors 190, 200 may become conductive when the input data signal transitions to a low state. For example, the data transistors 190, 200 may be PMOS transistors.

The sense amplifier 100 also may be populated by a pair of clocking transistors 210, 240. The first clocking transistor 210 couples the OUT terminal 160 to ground via a drain to source path. The second clocking transistor 240 couples the OUT# terminal 170 to ground via a drain to source path. Both clocking transistors 210, 240 receive the CLK signal via respective input terminals 120, 130. According to an embodiment, the clock transistors 210, 240 each may become conductive when the input signal applied to the clocking terminals 120, 130 is at a high state. For example, the clocking transistors may be NMOS transistors.

The sense amplifier 100 also may be populated by a plurality of clamping transistors 220 and 230. A first clamping transistor 220 couples the OUT terminal 160 to ground. It receives the signal from the OUT# terminal 170 as an input. A second clamping transistor 230 couples the OUT# terminal 170 to ground. It receives the signal from the OUT terminal 160 at an input.

According to an embodiment, the sense amplifier 100 may find application with "domino" LVS circuits having a precharge phase and an evaluation phase. The precharge phase is preparatory to the evaluation phase; the sense amplifier does not output active data. In the evaluation phase, the sense amplifier does output active data. The embodiment shown in FIG. 1 is directed an LVS system in which the clock signal CLK evaluates low.

Consider the sense amplifier in precharge. The CLK signal input at terminals 110–130 all are active (CLK=$V_{CC}$). The clocking transistors 210, 240 conduct thereby forcing both output terminals OUT and OUT# to ground. Further, the enabling transistor 180 is nonconductive in response to the CLK signal, thereby cutting off the path from $V_{CC}$ to the sources of the data transistors 190 and 200. Regardless of the state of the data signals D and D#, the OUT and OUT# terminals 160, 170 are maintained at ground during the precharge phase. Because the OUT and OUT# terminals 160, 170 both are at ground, the clamping transistors 220, 230 are nonconductive in the precharge phase.

Typically, in domino systems, the data signals D and D# are themselves characterized by a precharge phase and an evaluation phase. That is, the data signals D and D# carry information during the evaluation phase but not during the precharge phase. In the embodiment shown in FIG. 1, the data signals D and D# may be precharged low but transition high if they evaluate during the evaluation phase. During the precharge phase, the data transistors 190, 200 both are conductive.

Consider the sense amplifier during the evaluation phase. The CLK signal input at terminals 110–130 transition to ground (CLK=0 V). The clocking transistors 210, 240 become nonconductive. Further, the enabling transistor 180 becomes conductive, thereby applying $V_{CC}$ to the sources of the two data transistors 190, 200. The values of the OUT and OUT# terminals 160, 170 are determined by the data signals D and D# applied at input terminals 190 and 200.

The clamping transistors 220, 230 improve the sensitivity of the sense amplifier 100 and improve the speed of its operation. During the evaluation phase, one of the data signals D or D# will transition from the low precharge state toward a high state. The other complementary signal will remain low. As the evaluating signal D transitions high, its associated data transistor 200 becomes increasingly less conductive. However, the data transistor 190 associated with the non-evaluating signal (D#) remains conductive. Thus, the OUT terminal 160 transitions high. When the OUT terminal transitions high, the clamping transistor 230 begins to conduct thereby maintaining the OUT# terminal 170 at ground.

The inventor has performed computer simulations of the sense amplifier 100 shown in FIG. 1 and determined that the circuit generates useful evaluation outputs when the D and D# signals exhibit a voltage difference of about 100 mV.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A sense amplifier, consisting of:
   an enable transistor,
   first and second data transistors, each directly connected at sources thereof to a drain of the enable transistor,
   first and second clocking transistors, the first connected at a drain thereof to a drain of the first data transistor, the second connected at a drain thereof to a drain of the second data transistor, and
   first and second clamping transistors, the first connected at a drain thereof to the drain of the first data transistor and connected at a gate thereof to the drain of the second transistor, the second connected at a drain thereof to the drain of the second data transistor and connected at a gate thereof to the drain of the first transistor.

2. The sense amplifier of claim 1, wherein gates of the enable transistor and the two clocking transistors are mutually connected.

3. The sense amplifier of claim 1, wherein a source of the enable transistor is connected to a voltage source.

4. The sense amplifier of claim 1, wherein sources of the clocking transistors are connected to ground.

5. The sense amplifier of claim 1, wherein sources of the clamping transistors are connected to ground.

6. The sense amplifier of claim 1, wherein the enable transistor is a PMOS transistor.

7. The sense amplifier of claim 1, wherein the clocking transistors each are NMOS transistors.

8. The sense amplifier of claim 1, wherein the clamping transistors each are NMOS transistors.

9. The sense amplifier of claim 1, wherein the data transistors each are PMOS transistors.

10. The sense amplifier of claim 1, wherein the enable transistor becomes conductive in response to a low voltage signal.

11. The sense amplifier of claim 1, wherein the clocking transistors become conductive in response to a high voltage.

12. The sense amplifier of claim 1, wherein the clamping transistors become conductive in response to a high voltage.

13. The sense amplifier of claim 1, wherein the data transistors become conductive in response to a low voltage.

14. A sense amplifier circuit, consisting of:
   a pair of differential input terminals,
   a pair of differential output terminals,
   a pair of precharge transistors, each connecting a respective one of the differential output terminals to precharge potential, each having a clocking input and maintaining the respective differential output terminal at ground in response to a precharge state of a signal at the clocking input;
   a pair of evaluation transistors, each connecting a respective one of the differential output terminals to an evaluation potential, each coupled to a respective one of the differential input terminals and transitioning the respective differential output terminal to an evaluation voltage in response to an evaluation state of a signal at the respective differential input terminal;
   an enable transistor directly connected to each of the evaluation transistors to enable the connection to the evaluation potential; and
   a pair of clamping transistors, each connecting a respective one of the differential output terminals to ground and maintaining the respective one of the differential output terminal at ground in response to an evaluation voltage at the other of the differential output terminals.

15. The sense amplifier of claim 14, wherein the evaluation transistors include an enable circuit in a path between evaluation gates of the enable transistor and the two clocking transistors are mutually connected.

16. The sense amplifier of claim 14, wherein a source of the enable transistor is connected to a voltage source.

17. The sense amplifier of claim 14, wherein drains of the precharge transistors are connected to ground.

18. The sense amplifier of claim 14, wherein sources of the clamping transistors are connected to ground.

19. The sense amplifier of claim 14, wherein the enable transistor is a PMOS transistor.

20. The sense amplifier of claim 14, wherein the precharge transistors each are NMOS transistors.

21. The sense amplifier of claim 14, wherein the clamping transistors each are NMOS transistors.

22. The sense amplifier of claim 14, wherein the evaluation transistors each are PMOS transistors.

23. The sense amplifier of claim 14, wherein the enable transistor becomes conductive in response to a low voltage signal.

24. The sense amplifier of claim 14, wherein the precharge transistors become conductive in response to a high voltage.

25. The sense amplifier of claim 14, wherein the clamping transistors become conductive in response to a high voltage.

26. The sense amplifier of claim 14, wherein the evaluation transistors become conductive in response to a low voltage.

27. A method of detecting data present in low voltage swing signals, consisting of:

precharging a pair of differential output terminals to a precharge potential, receiving differential low voltage swing input signals in an evaluation phase, responsive only to one of the low voltage swing input signals transitioning toward an evaluation potential at an onset of an evaluation phase, charging an associated output terminal to the evaluation potential, responsive to a potential difference between the output terminals, clamping the output terminals to respective complementary potentials, wherein the output terminal associated with the evaluating input signal is clamped to the evaluation potential and the other output terminal is clamped to the precharge potential.

28. A method of detecting data present in low voltage swing signals, consisting of:

precharging a pair of differential output terminals to a precharge potential, receiving differential low voltage swing input signals in an evaluation phase, responsive only to one of the low voltage swing input signals transitioning toward an evaluation potential at an onset of an evaluation phase, charging an associated output terminal to the evaluation potential, isolating a non-evaluating output terminal from the evaluation potential in accordance with the low voltage input signal corresponding to the non-evaluating output terminal, and responsive to a potential difference between the output terminals, clamping the output terminals to respective complementary potentials, wherein the output terminal associated with the evaluating input signal is clamped to the evaluation potential and the other output terminal is clamped to the precharge potential.

29. A method of detecting data present in low voltage swing signals, consisting of:

precharging a pair of differential output terminals to a precharge low potential, receiving differential low voltage swing input signals in an evaluation phase, responsive only to one of the low voltage swing input signals transitioning from the precharge low potential toward an evaluation high potential during the evaluation phase, charging an associated output terminal to the evaluation high potential, and responsive to a potential difference between the output terminals, clamping the output terminals to respective complementary potentials, wherein the output terminal associated with the evaluating input signal is clamped to the evaluation high potential and the other output terminal is clamped to the precharge low potential.

* * * * *

UNITED STATES PATENT AND TRADEMARK OFFICE
CERTIFICATE OF CORRECTION

PATENT NO.   : 6,456,121 B2
DATED        : September 24, 2002
INVENTOR(S)  : Kevin X. Zhang It is certified that error appears in the above-identified patent and that said Letters Patent is hereby corrected as shown below:

<u>Column 4,</u>
Lines 44-47, delete "15. The sense amplifier of claim 14, wherein the evaluation transistors include an enable circuit in a path between evaluation gates of the enable transistor and the two clocking transistors are mutually connected." replace with
-- 15. The sense amplifier of claim 14, wherein the sense ampliifier can generate a differential output signal on the output terminal in response to voltage differences at the input terminals as low as 100mV. --

Signed and Sealed this

Twenty-seventh Day of April, 2004

JON W. DUDAS
*Acting Director of the United States Patent and Trademark Office*